(12) United States Patent
Liptac et al.

(10) Patent No.: US 11,652,180 B2
(45) Date of Patent: May 16, 2023

(54) SOLAR ENERGY RECEIVER

(71) Applicant: Maxeon Solar Pte. Ltd., Singapore (SG)

(72) Inventors: John Liptac, Mountain House, CA (US); Paul Dentinger, Sunol, CA (US); Robert Lamkin, Pleasanton, CA (US); James Page, Oakland, CA (US); Tom Reynolds, Livermore, CA (US)

(73) Assignee: Maxeon Solar Pte. Ltd., Marina Bay Financial Centre (SG)

( * ) Notice: Subject to any disclaimer, the term of this patent is extended or adjusted under 35 U.S.C. 154(b) by 0 days.

(21) Appl. No.: 15/815,420

(22) Filed: Nov. 16, 2017

(65) Prior Publication Data

US 2018/0145201 A1   May 24, 2018

Related U.S. Application Data

(63) Continuation of application No. 13/442,740, filed on Apr. 9, 2012, now abandoned.
(Continued)

(51) Int. Cl.
*H01L 31/0525* (2014.01)
*G01S 3/786* (2006.01)
(Continued)

(52) U.S. Cl.
CPC .......... *H01L 31/0525* (2013.01); *F24S 50/20* (2018.05); *G01S 3/7861* (2013.01); *H01L 31/0201* (2013.01); *H01L 31/022433* (2013.01); *H01L 31/035281* (2013.01); *H01L 31/042* (2013.01); *H01L 31/048* (2013.01); *H01L 31/0508* (2013.01); *H01L 31/0547* (2014.12);
(Continued)

(58) Field of Classification Search
CPC .. H01L 31/0525; H01L 31/0547; H02S 20/32
See application file for complete search history.

(56) References Cited

U.S. PATENT DOCUMENTS 4,617,421 A * 10/1986 Nath ................. H01L 31/03921
                                                       136/244
6,414,235 B1 * 7/2002 Luch ..................... H01L 31/048
                                                       136/244
(Continued)

FOREIGN PATENT DOCUMENTS

EP         2395563 A1 * 12/2011   ....... H01L 31/02013
WO   WO 2015/183827 A2   12/2015

*Primary Examiner* — Tae-Sik Kang
(74) *Attorney, Agent, or Firm* — Oblon, McClelland, Maier & Neustadt, L.L.P.

(57) ABSTRACT

Embodiments of the present invention may utilize one or more techniques, alone or in combination, to maximize a surface area of a receiver that is configured to convert light into another form of energy. One technique enhances collection efficiency by controlling a size, shape, and/or position of a cell relative to an expected illumination profile under various conditions. Another technique positions non-active elements (such as electrical contacts and/or interconnects) on surfaces likely to be shaded from incident light by other elements of the receiver. Another technique utilizes embodiments of interconnect structures occupying a small footprint. According to certain embodiments, the receiver may be cooled by exposure to a fluid such as water or air.

6 Claims, 16 Drawing Sheets

Related U.S. Application Data

(60) Provisional application No. 61/475,483, filed on Apr. 14, 2011.

(51) Int. Cl.
*H01L 31/02* (2006.01)
*H01L 31/042* (2014.01)
*H01L 31/048* (2014.01)
*H01L 31/0352* (2006.01)
*H01L 31/05* (2014.01)
*H02S 20/32* (2014.01)
*H01L 31/054* (2014.01)
*F24S 50/20* (2018.01)
*H01L 31/0224* (2006.01)

(52) U.S. Cl.
CPC ............... *H02S 20/32* (2014.12); *Y02E 10/47* (2013.01); *Y02E 10/52* (2013.01)

(56) References Cited

U.S. PATENT DOCUMENTS

| | | | | |
|---|---|---|---|---|
| D600,200 S | * | 9/2009 | Dimov | D13/102 |
| 2003/0047208 A1 | * | 3/2003 | Glenn | H01L 31/052 |
| | | | | 136/246 |
| 2005/0022857 A1 | * | 2/2005 | Daroczi | H01L 31/022441 |
| | | | | 136/244 |
| 2006/0000178 A1 | * | 1/2006 | Almy | E04D 1/34 |
| | | | | 52/543 |
| 2008/0053522 A1 | * | 3/2008 | Basol | H01L 31/0749 |
| | | | | 136/256 |
| 2010/0116314 A1 | * | 5/2010 | Fukushima | C09J 9/02 |
| | | | | 136/244 |
| 2010/0126565 A1 | * | 5/2010 | Takeda | C03C 8/18 |
| | | | | 136/252 |
| 2010/0136718 A1 | * | 6/2010 | Meisel | H01L 31/1804 |
| | | | | 438/16 |
| 2011/0079274 A1 | * | 4/2011 | Kang | H01G 9/2068 |
| | | | | 136/252 |
| 2012/0125391 A1 | * | 5/2012 | Pinarbasi | H01L 31/0504 |
| | | | | 136/244 |

\* cited by examiner

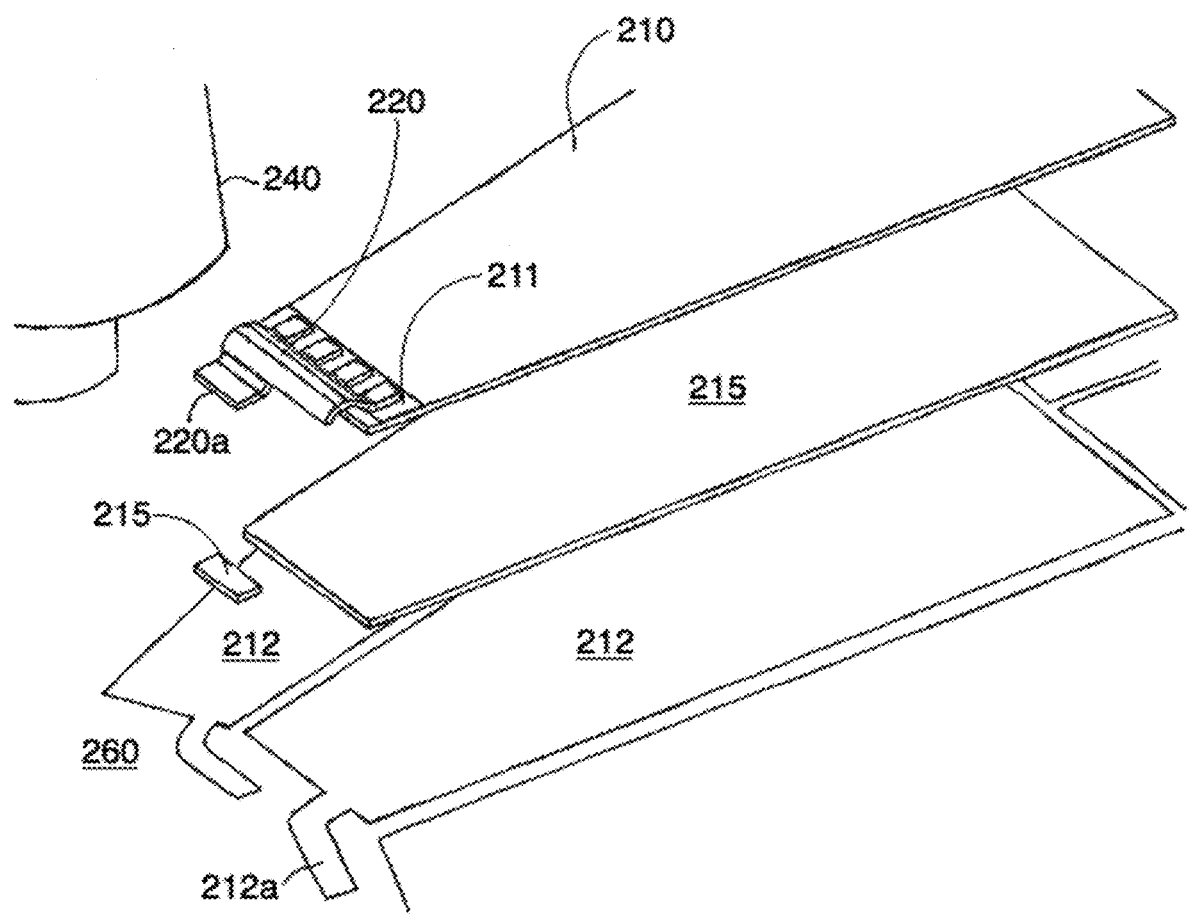
Fig. 2A
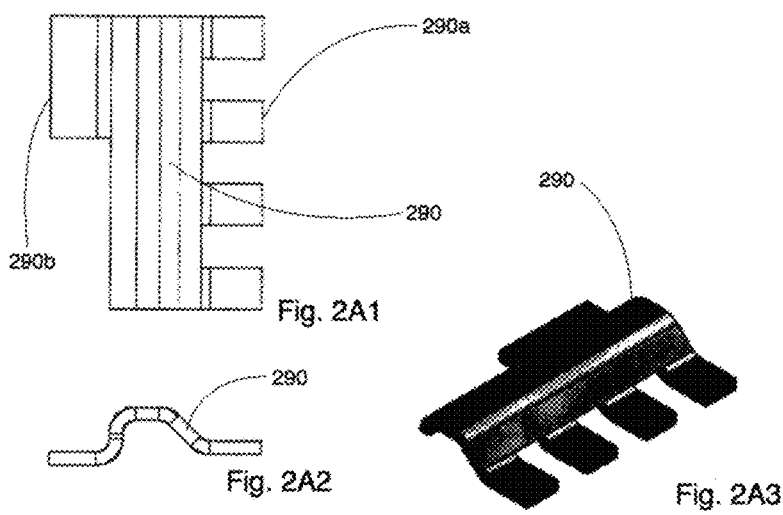
Fig. 2A1
Fig. 2A2
Fig. 2A3

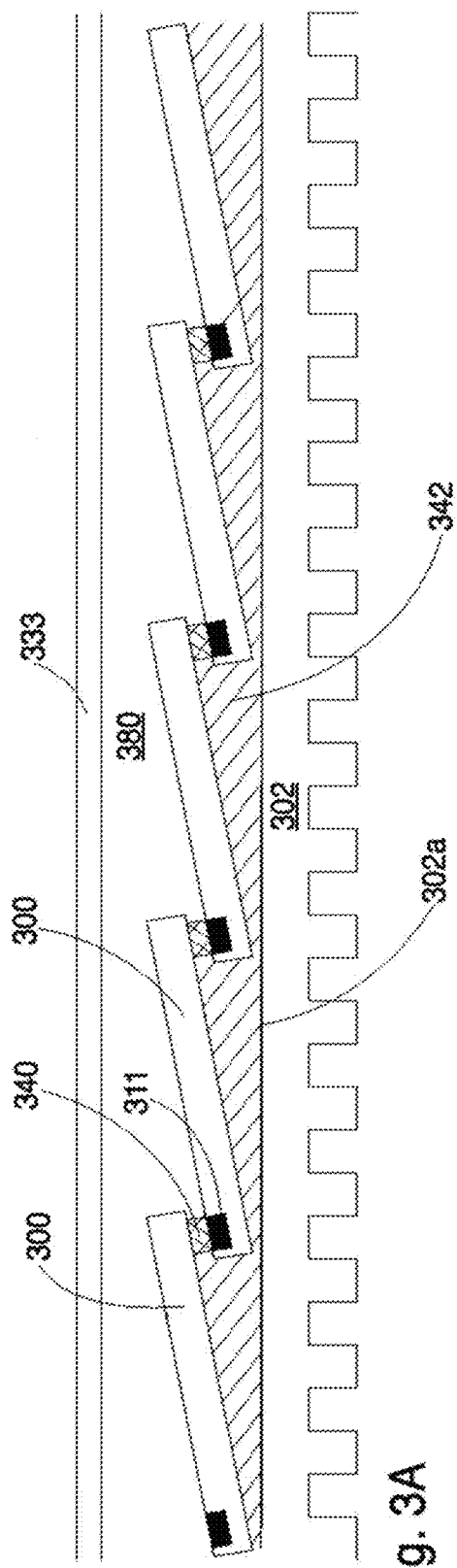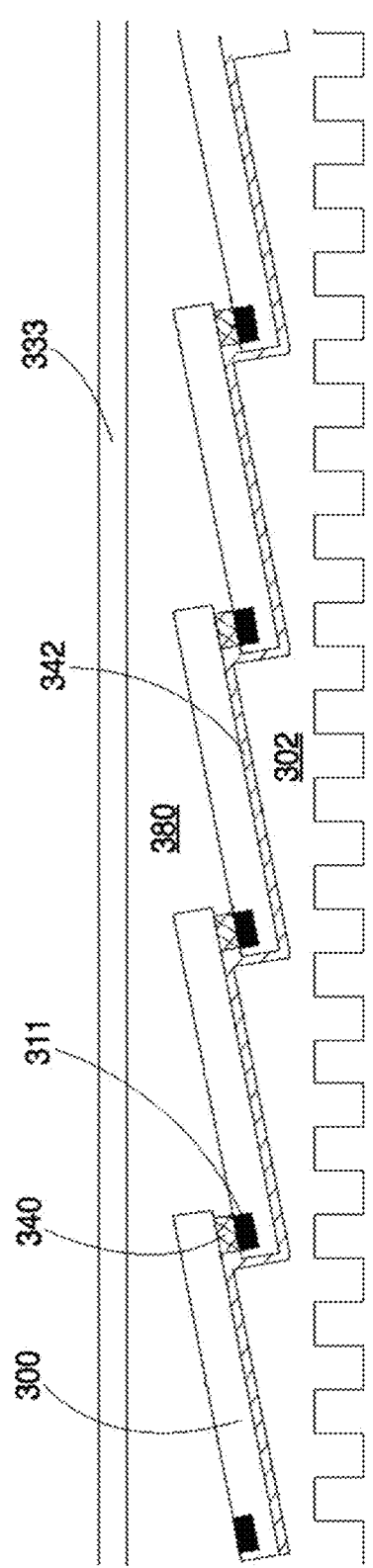
Fig. 3A
Fig. 3B

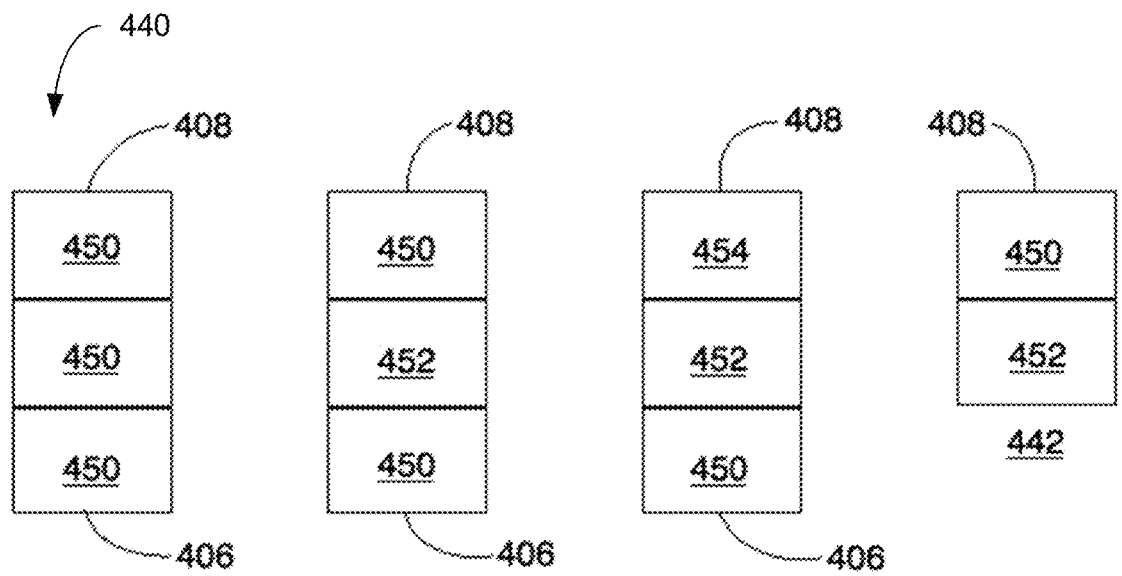
Fig. 4C1　　Fig. 4C2　　Fig. 4C3　　Fig. 4C4
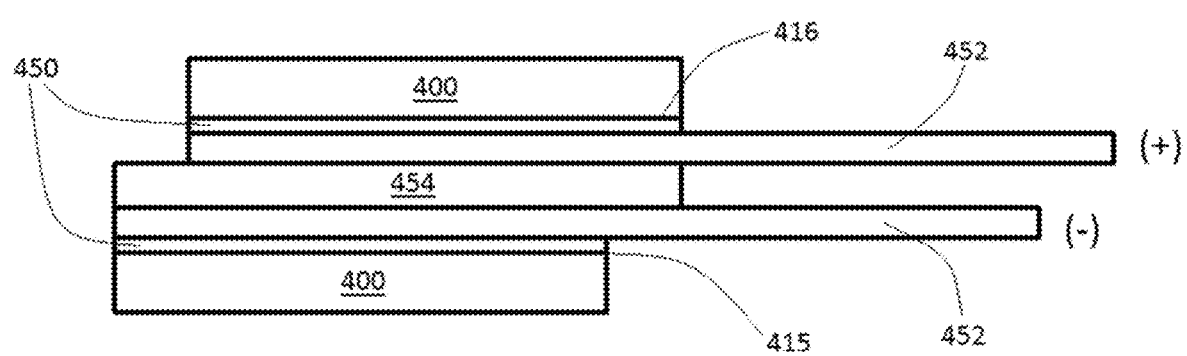
Fig. 4C5

SOLAR ENERGY RECEIVER

CROSS-REFERENCES TO RELATED APPLICATIONS

This application is a continuation of U.S. patent application Ser. No. 13/442,740, filed Apr. 9, 2012, which application claims the benefit of U.S. Provisional Patent Application No. 61/475,483, filed Apr. 14, 2011, the entire contents of each which are hereby incorporated by reference in their entirety for all purposes.

BACKGROUND

Solar radiation is the most abundant energy source on earth. However, attempts to harness solar power on large scales have so far failed to be economically competitive with most fossil-fuel energy sources.

One reason for the lack of adoption of solar energy sources on a large scale is that fossil-fuel energy sources have the advantage of economic externalities, such as low-cost or cost-free pollution and emission. Another reason for the lack of adoption of solar energy sources on a large scale is that the solar flux is not intense enough for direct conversion at one solar flux to be cost effective. Solar energy concentrator technology has sought to address this issue. For example, solar radiation energy is easily manipulated and concentrated using refraction, diffraction, or reflection to produce solar radiation energy having many thousands of times the initial flux. This can be done using only modest materials such as refractors, diffractors and reflectors.

Specifically, solar radiation is one of the most easy energy forms to manipulate and concentrate. It can be refracted, diffracted, or reflected to many thousands of times the initial flux utilizing only modest materials.

With so many possible approaches, there have been a multitude of previous attempts to implement low cost solar energy concentrators. So far, however, solar concentrator systems cost too much to compete unsubsidized with fossil fuels, in part because of large amounts of material and large areas that that solar collectors occupy. The large amounts of materials used to make solar concentration systems and the large areas that are occupied by solar concentration systems render solar concentration systems unsuitable for large-scale solar farming.

Accordingly, there is a need in the art for improved apparatuses and methods for the collection of solar energy.

BRIEF SUMMARY

Embodiments of the present invention may utilize one or more techniques, alone or in combination, to maximize a surface area of a receiver that is configured to convert light into another form of energy, for example, electricity. One embodiment of the present invention provides a technique that enhances collection efficiency of the receiver by controlling a size, shape, and/or position of a photo-sensitive cell relative to an expected illumination profile under various conditions. Another technique described herein positions non-active elements (such as electrical contacts and/or interconnects) on surfaces likely to be shaded from incident light by other elements of the receiver. Another technique utilizes embodiments of interconnect or contact structures occupying a small footprint. According to certain embodiments, the receiver may be cooled by exposure to a fluid such as water or air.

Another embodiment of the present invention provides a solar energy receiver that includes location sensors for determining location of the Sun at any given time and providing the location information to a tracking system that can orient the solar receiver optimally.

Certain embodiments of the present invention provide a solar energy receiver. The solar energy receiver includes a support structure, a plurality of active photovoltaic (PV) devices disposed on the support structure. Each PV device includes an active receiver element and one or more non-active elements. The plurality of PV devices are arranged such that active receiver element of a first PV device at least partially hides a non-active element of a second PV device from incident light. In some embodiments, the active receiver element comprises a reflector and wherein the reflector comprises a central reflector and/or a peripheral reflector. In some embodiments, the support structure further comprises a thermally conducting substrate having an upper surface and an opposing lower surface, a metal layer disposed on the lower surface, one or more cooling channels coupled to the lower surface, and a printed circuit board (PCB) coupled to the upper surface. In some embodiments, the active PV cells are non-square in shape. In one embodiment, the plurality of active PV devices are disposed in an annular arrangement.

Another embodiment of the present invention provides a solar energy receiver that includes a first photovoltaic (PV) device and a second PV device. The first PV device comprises a first front surface and a first front contact disposed on the first front surface and having a first electrical polarity. The first front contact occupies a portion of the first front surface. The first PV device further includes a first back surface and a first back contact disposed on the first back surface that has a second electrical polarity opposite to the first electrical polarity. The first back contact occupies a portion of the first back surface. The second PV device comprises a second front surface and a second front contact disposed on the second front surface and having a third electrical polarity. The second front contact occupies a portion of the second front surface. The second PV cell also includes a second back surface and a second back contact disposed on the second back surface and having a fourth electrical polarity opposite to the third electrical polarity. The second back contact occupies a portion of the second back surface. In some embodiments, the second front contact of the second PV device underlies the first back contact of the first PV device and wherein only the portion of the first back surface of the first PV device overlies the second front surface of the second PV device.

In some embodiments, the solar energy receiver includes a third photovoltaic (PV) device that includes a third front surface and a third front contact disposed on the third front surface and having a fifth electrical polarity. The third front contact occupies a portion of the third front surface. The third PV device also includes a third back surface and a third back contact disposed on the third back surface and having a sixth electrical polarity opposite to the fifth electrical polarity. The third back contact occupies a portion of the third back surface. In this solar energy receiver, the second back contact of the second PV device overlies the third front contact of the third PV device and wherein only the portion of the second back surface of the second PV device overlies the third front surface of the third PV device. In some embodiments, the shape of the first and/or the second PV device can be non-square such as a rectangle, a trapezoid, or a polygon.

In some embodiments, the second front contact of the second PV device is electrically connected to the first back contact of the first PV device using an electrically conducting adhesive. In other embodiments, the second front contact of the second PV device is electrically connected to the first back contact of the first PV device using a connection stack. In an embodiment, the connection stack can be multi-layered.

Other embodiments of the present invention provide a system that includes a solar energy receiver, a plurality of extent sensors coupled to the solar energy receiver, and a tracking mechanism coupled to the solar energy receiver. The solar energy receiver may include a plurality of active PV devices. The plurality of extent sensors are configured to track a position of the sun in the sky and provide the position information to the tracking mechanism. The tracking mechanism is configured to orient the solar energy receiver based on the position information received from the plurality of extent sensors. The tracking mechanism further includes tracking control unit configured to receive the position information from the plurality of extent sensors and a positioning structure and determine an orientation for the solar energy receiver and a motor control unit configured to receive coordinates for the orientation from the tracking control unit and operate one or more motors to orient the solar energy receiver in the desired orientation.

These and other embodiments of the present invention, as well as its features and some potential advantages are described in more detail in conjunction with the text below and attached figures.

BRIEF DESCRIPTION OF THE DRAWINGS

FIGS. 1A-1B show perspective views of front-contact photovoltaic (PV) cells according to an embodiment of the present invention.

FIG. 2A is a simplified exploded view showing the placement of one active cell on the support of the receiver according to an embodiment of the present invention.

FIGS. 2A1-2A3 show various views of another embodiment of a multi-prong contact structure according to an embodiment of the present invention.

FIG. 3A shows a simplified cross-sectional view a receiver employing the shingling technique according to an embodiment of the present invention.

FIG. 3B shows a simplified cross-sectional view of an alternative embodiment of a receiver employing the shingling technique.

FIG. 4C1 shows a simplified cross-sectional view of a connection stack, in accordance with an embodiment of the present invention.

FIG. 4C2 shows a simplified cross-sectional view of another connection stack, in accordance with another embodiment of the present invention.

FIG. 4C3 shows a simplified cross-sectional view of a connection stack, in accordance with yet another embodiment of the present invention.

FIG. 4C4 shows a simplified cross-sectional view of a connection stack, in accordance with still another embodiment of the present invention.

FIG. 4C5 shows a simplified cross-sectional view of a connection stack in order to access positive and negative terminals of an annulus of cells in accordance with still another embodiment of the present invention.

FIG. 5 shows a simplified schematic diagram of a solar receiver with extent sensors positioned outside the illuminated area according to an embodiment of the present invention.

DETAILED DESCRIPTION

Figure 1:
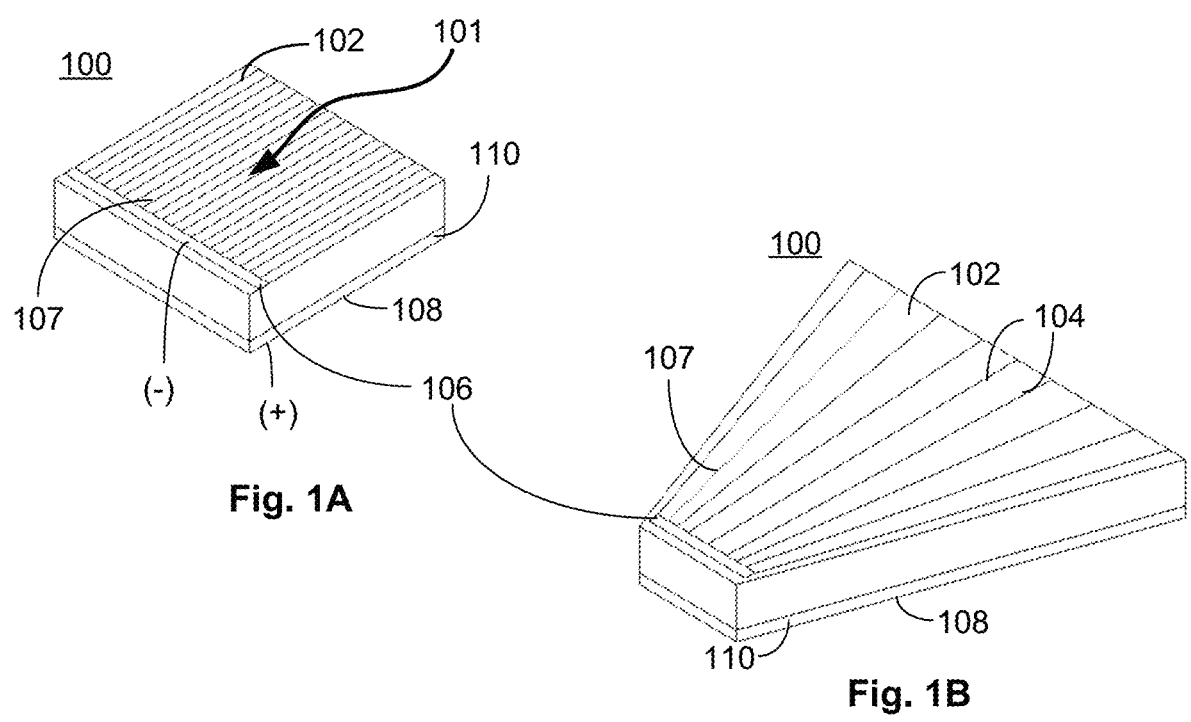

Embodiments of receivers in accordance with the present invention may be employed in connection with optical collector devices, including but not limited to those utilizing inflatable concentrators as described in U.S. patent application Ser. No. 11/843,531, filed Aug. 22, 2007, which is incorporated by reference in its entirety herein for all purposes.

U.S. patent application Ser. No. 13/227,093, filed Sep. 7, 2011, disclosing a solar collector having a receiver positioned external to an inflation space or volume, is incorporated by reference in its entirety herein for all purposes. Embodiments of the present invention may share one or more characteristics in common with the apparatuses disclosed in that patent application.

U.S. patent application Ser. No. 12/720,429, filed on Mar. 9, 2010, describing mounting structures and other concepts, is also incorporated by reference in its entirety herein for all purposes.

U.S. patent application Ser. No. 13/015,339 filed on Jan. 27, 2011 describing mounting structures and other concepts is also incorporated by reference in its entirety herein for all purposes.

Receivers according to particular embodiments may share one or more features with those described in U.S. Patent Publication No. 2008/0135095, which is also incorporated by reference herein for all purposes.

Further incorporated by reference herein for all purposes, is U.S. Patent Publication No. 2010/0295383, which describes various embodiments of power plants. Embodiments of receivers in accordance with the present invention may be incorporated into power plants exhibiting one or more features disclosed in that patent application.

Embodiments of the present invention relate to receiver structures for use in harnessing solar energy. Receivers typically comprise an array of individual active elements that are sensitive to incoming light.

FIG. 1A shows a perspective view of one such active element including a front-contact photovoltaic (PV) cell 100. Front-contact PV cell 100 receives incident light 101 through front surface 102, and generates electrical power therefrom.

The electrical power generated within cell 100 flows through conducting fingers 104 in electrical communication with busbar 106, which together form a comb-like structure 107 as illustrated in FIG. 1B. Busbar 106 typically serves as the negative node of the front contact PV cell. Back surface 108 of front-contact PV cell 100 bears conducting layer 110 serving as the positive node of the front-contact PV cell.

Individual solar cells can have relatively low voltages determined by the band gap of the semiconductor(s) used, and non-idealities present within PV devices. For example if the PV cell of FIG. 1A comprises silicon, then an output voltage of about 0.6 V can be expected. Multi junction cells can have higher voltages. Accordingly, a receiver may comprise multiple solar cells connected in series in order to obtain a higher output voltage.

One challenge in developing a multi-element receiver for Concentrated Photovoltaic (CPV) applications is reducing or eliminating surface area of the receiver that is occupied by non-active elements. As used herein, the term 'grout' refers to illuminated receiver area that is incapable of converting light into electricity. Typically grout comprises busbars, interconnects, traces, and the spacing between solar cells.

Accordingly, embodiments of the present invention employ various methods, alone or in combination, to minimize or eliminate the grout. In certain embodiments, the shapes of the active cells are chosen to minimize grout. In certain embodiments, elements of the receiver are positioned to hide non-active elements under other elements of the receiver, for example, reflectors or active elements. Other techniques which may be employed include the use of an interconnect structure having a small footprint, the use of an interconnect as an optical element itself, the use of back contact cells, and the use of shingling wherein non-active portions of the cells overlap one another. These are described in detail below.

Solar cell manufacturing techniques allow PV cells to be in non-rectangular shapes. A shaped PV cell may be tessellated so as to minimize the spacing between cells and grout.

Attachment of a PV cell to the receiver and the associated electrical connections may greatly influence the function of a CPV receiver. The attachment vehicle may be a conducting or an insulating adhesive depending on the type of electrical communication desired. As used herein the term "electrically conducting adhesive" or ECA includes but is not limited to solder, epoxy, acrylic, polyimide, polyurethanes, cyanate esters, silicone, or the like and combinations thereof that allow electrical communication through the material. As used herein the term "insulating adhesive" includes but is not limited to epoxy, acrylic, polyimide, polyurethanes, cyanate esters, silicone, or the like and combinations thereof that does not allow electrical communication through the material.

Figure 2:
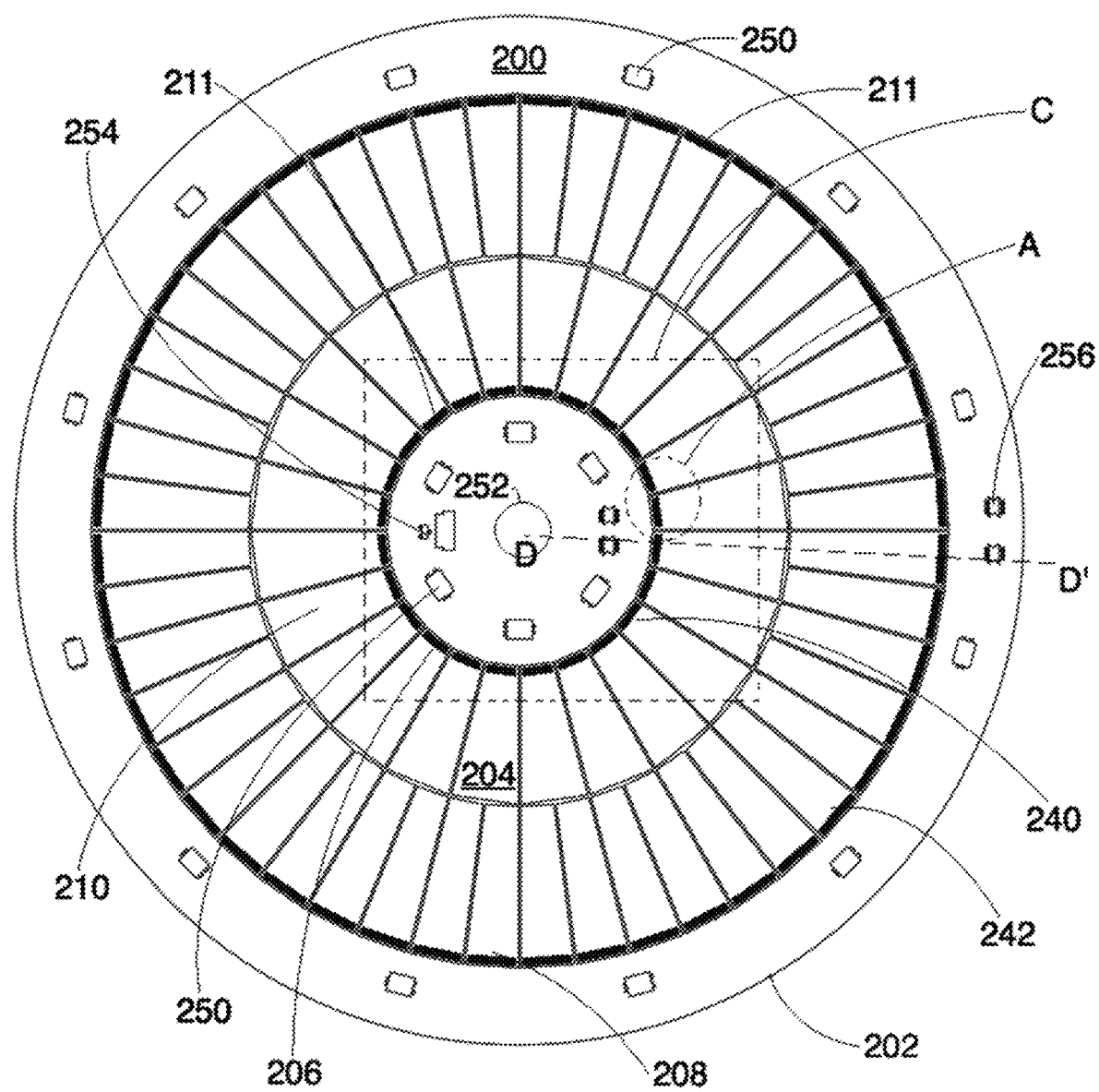
FIG. 2 shows a simplified plan view of a receiver according to an embodiment of the present invention.
Figure 2B:
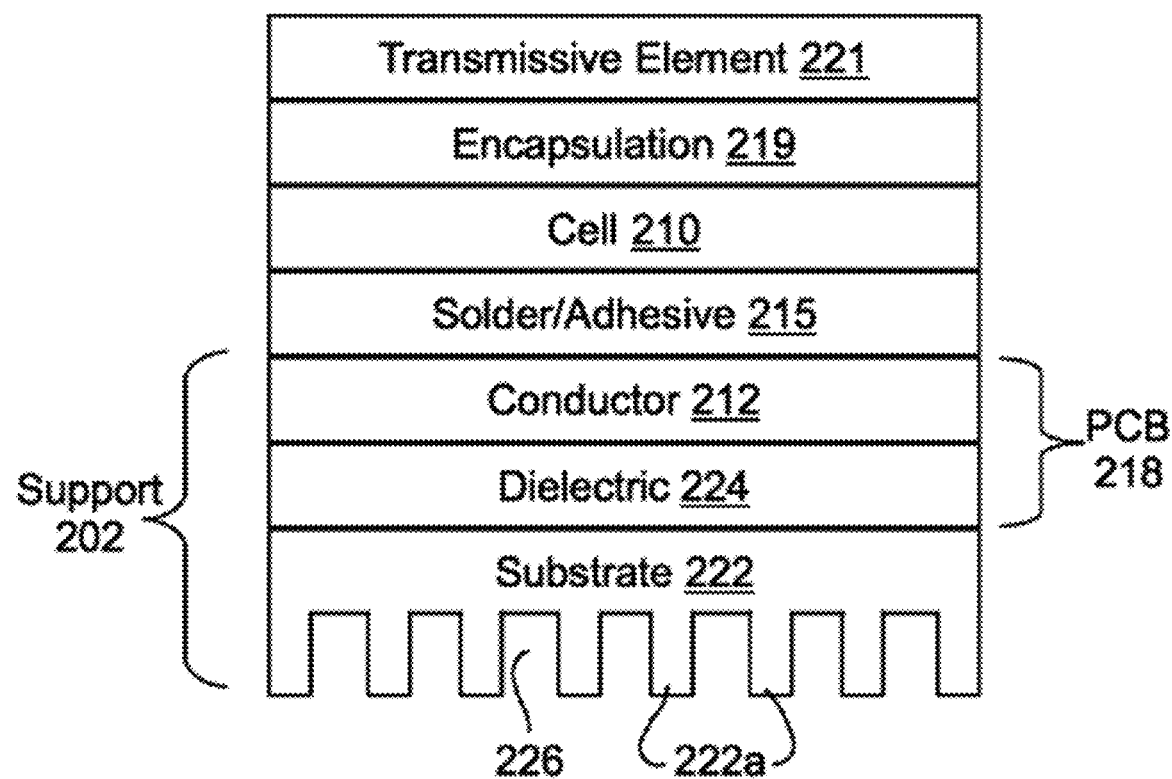
FIG. 2B shows a simplified generic cross-sectional view of a receiver structure according to an embodiment of the present invention.
Figure 2C:
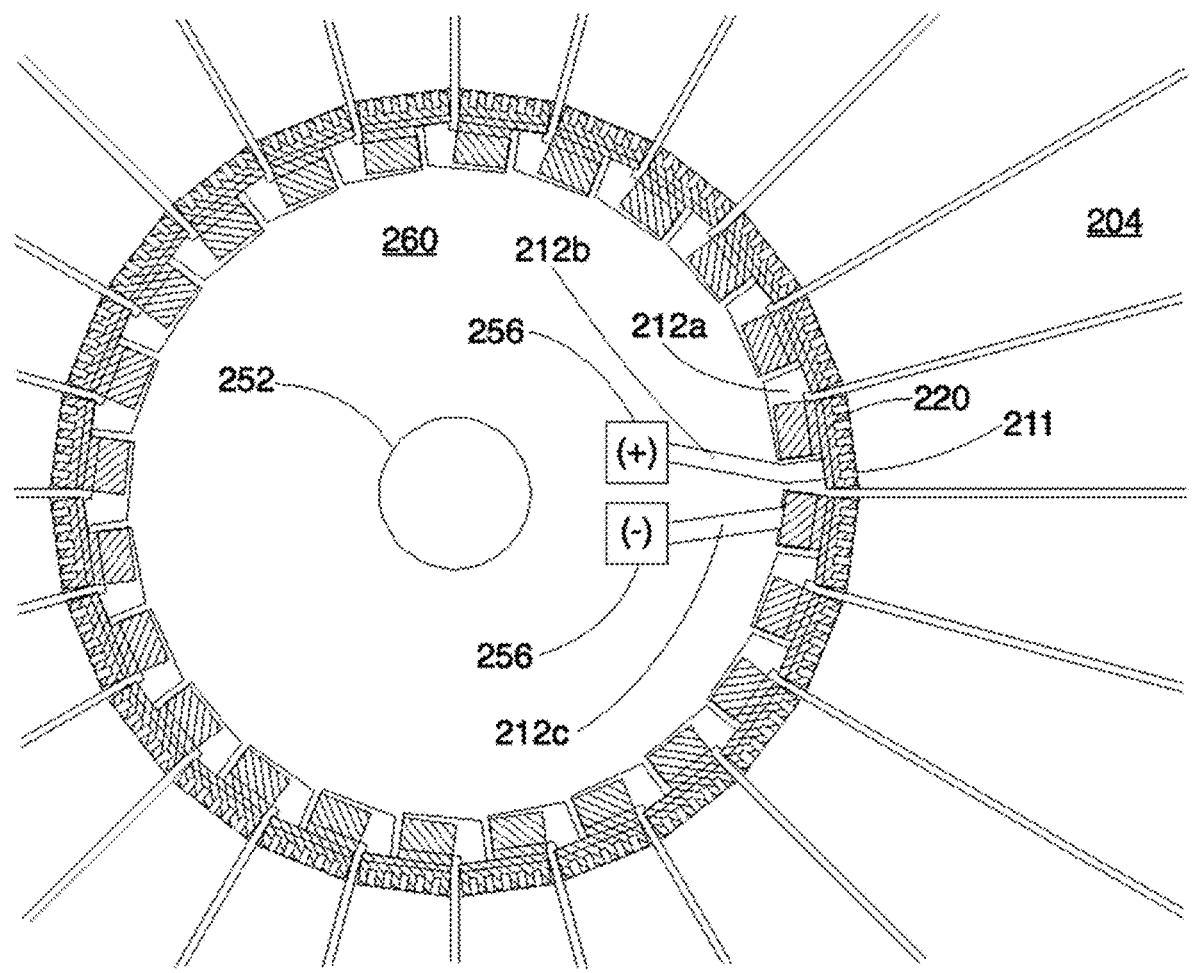
FIG. 2C shows an enlarged view of a portion of the receiver showing the serial connection of the cells according to an embodiment of the present invention.
Figure 2D:
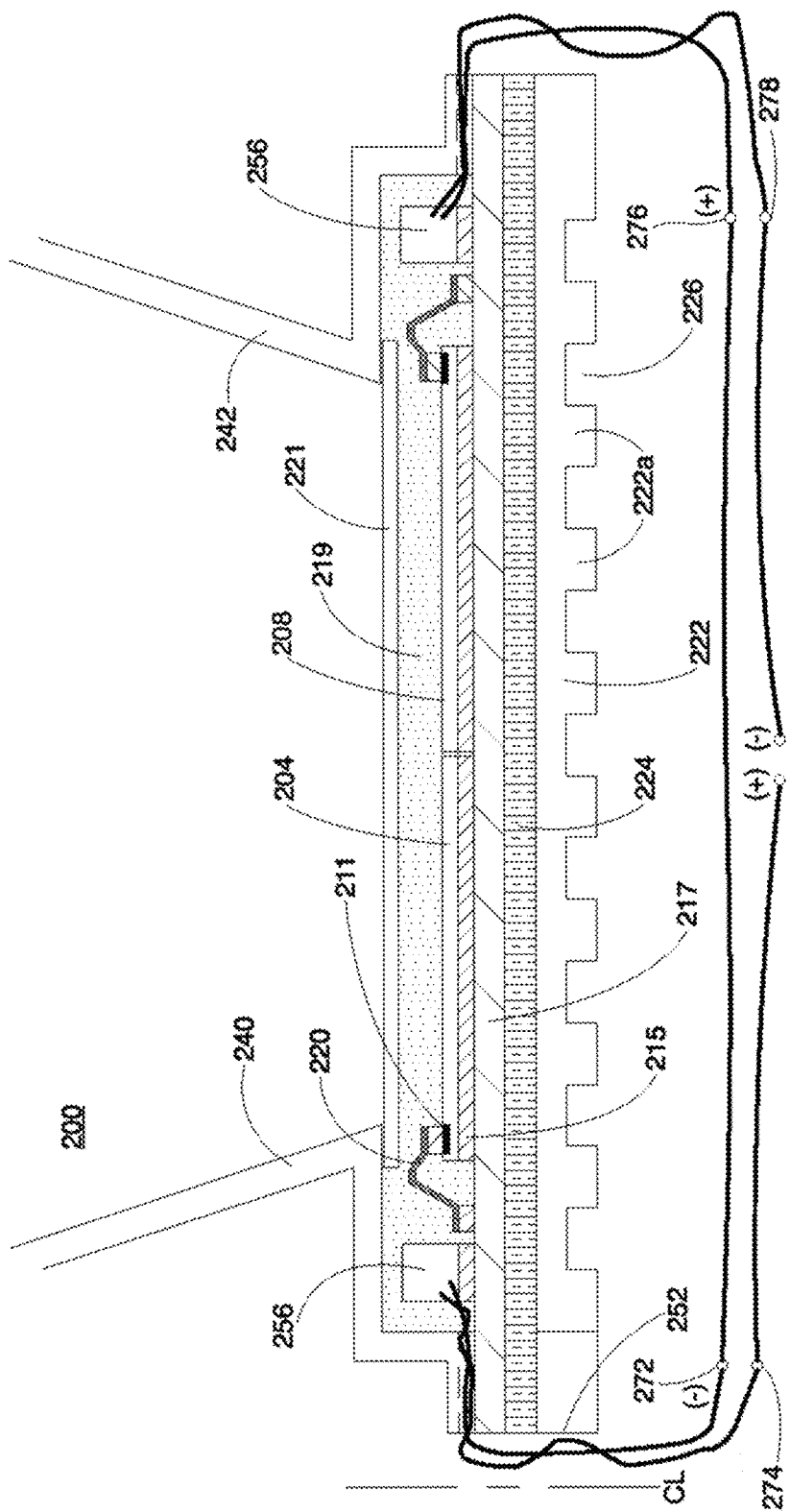
FIG. 2D shows a more detailed cross-sectional view of the receiver according to an embodiment of the present invention.

For example, FIGS. 2-2D shows simplified views of a receiver 200 according to one embodiment of the present invention. Receiver 200 comprises a support 202 bearing a plurality of discrete active elements 204 that are connected in series. In this particular embodiment, receiver 200 includes an inner ring 206 and an outer ring 208 which support a plurality of front-contact PV cells 210 having busbars 211.

As illustrated in FIG. 2, each PV cell 210 is in the shape of a trapezoid comprising approximately the same area, such that a uniform illumination profile will generate approximately the same amount of current in each cell. In this embodiment, PV cells 210 may be shaped as angular wedges or trapezoids in order to create a circle-like shape. As front contact cells are used, busbars 211 may be grouped together on inside ring 206 and/or outside ring 208, where they can underlie optical elements such as central reflector 240 or peripheral reflector 242 in such a way as to avoid shading of the active cell area. For example, the corresponding exploded view of receive 200 as illustrated in FIG. 2A shows a portion of the central reflector 240 overhanging the busbar 211 of the front contact cell.

In certain embodiments, single or multiple rings of cells may be used in such a way as to minimize grout by covering with inner and outer optical elements. Here, for example, two annuli of cells are combined, with series connections made cell-to-cell around the inner and outer rings. Inner ring 206 and outer ring 208 may be connected in series on a single layer PCB using a through hole 252 connection on the inside of the inner ring as illustrated in FIG. 2. Hiding busbars 211 and other non-active components (such as bypass diodes 250, through hole connections 252, or temperature sensors 254) under optical elements in this manner, minimizes grout by reflecting or refracting light that would usually be lost back onto the cell active area.

FIG. 2A is a simplified exploded view showing the placement of one active cell on the support 202 according to an embodiment of the present invention. In particular, a first portion 212a of conductor layer 212 that is present on the surface of support 202 extends from underneath the cell to establish electrical communication with the positive node through a layer 215 of conducting adhesive. Soldermask 260 can also be present over conductor layer 212 and dielectric 224 (shown in FIG. 2B).

FIG. 2A shows that a second conductor 220 extends upward to establish electrical communication with busbar 211 on the top surface of the cell, again through conducting adhesive layer 215. In one embodiment, grout is minimized by creating a compact electrical connection from the top of a cell to the PCB level. FIG. 2A shows that conductor 220 exhibits a multi-prong structure with one or multiple legs 220a in order to minimize the area needed to create a two terminal connection from a front contact cell. This small footprint interconnect method provides the needed electrical connectivity, while being flexible enough to allow for thermal expansion mismatch between differing materials.

FIGS. 2A1-2A3 show various views of an elongated embodiment of a multi-prong contact structure 290, which may be used to make contact with a busbar of a larger cell. In particular, the portion 290a of the elongated multi-prong contact facing the cell extends along close to a full expected length of the busbar, to maximize electrical contact therewith. By contrast, the opposite portion 290b of the elongated multi-prong contact 290 facing the support 220a (and conducting traces patterned thereon) does not extend the full length of the busbar, leaving space on the PCB trace for the contact with the backside of the cell.

In certain embodiments, contacts (including the multi-pronged contact) and/or interconnects may themselves comprise an optical element. For example in some embodiments, the shape of the non-active element can be chosen to minimize shading. Also, particular embodiments may have the contact or interconnect be configured to reflect light back onto the active cell area of the receiver. The multi-pronged contact may be combined with the cell to create a package, using a conducting adhesive. In addition to conducting adhesives, techniques such as ultrasonic or laser welding may be used. Such combination of the contact and cell into a single package may facilitate high volume production utilizing simple automated assembly through the use of pick and place technology. The underside contact of the package may be attached to the board using conducting adhesive. Connections may be made for series, parallel, or combinations thereof.

FIG. 2B shows a simplified generic cross-sectional view of a receiver 200 according to an embodiment of the present invention. In particular, this figure shows the cell 210 in contact with support 202 through solder/adhesive layer 215. Support 202 comprises a Printed Circuit Board (PCB) 218 in contact with a substrate 222 having favorable thermally conducting and physical structural support properties. In some embodiments, substrate 222 can include thermally conductive material such as aluminum or copper.

PCB 218 in turn comprises conductor layer 212 (typically patterned traces) such as copper, overlying a dielectric layer 224 (which may have through holes penetrating there through). Examples of materials that may be used for the dielectric layer include but are not limited insulating adhesives with high thermal conductivity, ceramics such as alumina, aluminum nitride, or proprietary compounds such as COOLAM™ available from DuPont of Wilmington, Del., and THERMAL CLAD® available from The Bergquist Company of Chanhassen, Minnesota. An encapsulant 219 and transmissive optical element 221 seal and weatherize the receiver as well as provide mechanical protection for the cells. Sealing the cells and interconnects is important in order to minimize performance degradation that can arise, for example, from corrosion or electromigration of the solar cell metallization. The encapsulation material is chosen to match the index of refraction of the transmissive element and minimize reflection. Examples of materials that can be used as encapsulant 219 include but are not limited to silicones, ionomers, or ethylene vinyl acetate (EVA).

As illustrated in FIG. 2B, the backside of substrate 222 includes integral raised portions 222a defining channels 226 in-between two adjacent portions 222a. Channels 226 increase the surface area of substrate 222 and increase heat transfer for natural or forced convection cooling. Such channels may also be formed through reliefs. Skiving may also be used to increase the surface area of substrate 222. A fluid (such as air or water) can be circulated through these channels and can constitute a cooling system that can be used to control the temperature of the receiver.

FIG. 2C shows an enlarged view of the inner ring portion of the receiver showing the serial connection of the cells according to an embodiment of the present invention. The positive terminal of a first cell 220 is coupled to a connector 256 through trace 212b. From there on, each adjacent cell has its positive node 212a connected to the negative node of the next cell around the ring. At the final cell in the inner ring the negative node is also coupled to connector 256 via trace 212c. The rings also may be in serial connection with one another. Wires can be routed from connector 256 through hole 252 to connect the inner ring in series with the outer ring via a connector of the outer ring. Outer ring connections can be made in a similar manner as that of the inner ring described above.

FIG. 2D shows a more detailed cross-sectional view of receiver 200 taken along line D-D' of FIG. 2. FIG. 2D shows that resulting positive and negative nodes for the inner and outer strings of active devices can be connected with each other and with external circuitry through hole 252 and using wires from connectors 256. Positive node 276 from the outer ring can be connected with the negative node 272 of the inner ring producing a serial connection of all the cells with the remaining leads 274 and 278.

Transmissive optical element 221 may be refractive and/or shaped include and/or homogenizing properties. Homogenizing properties can be obtained through coatings or surface treatments, which minimize loss. Central reflector element 240 and peripheral reflector element 242 can have homogenizing properties as well. Examples of materials that can be used as transmissive optical element 221 include but are not limited to low iron tempered glass, fluoropolymers, fused silica, silicone, etc. Certain embodiments of the present invention may include traces and or interconnects across the top surface of the support. This grout can also be covered with optical elements used to reflect or refract light back onto the active area.

FIG. 2D also shows receiver 200 as further comprising central reflecting element 240 and peripheral reflecting element 242. These reflecting elements serve to re-direct light incident on the central and peripheral portions to the active elements for collection. This further enhances the collection efficiency of receiver 200 and also increases tolerance for tracking the source of illumination (e.g. the sun moving across the sky).

In the particular embodiment illustrated in FIGS. 2-2D, busbars 211 and connections between the active devices on each ring are positioned proximate to the corresponding (central or peripheral) reflecting element. In this manner, the surface area of receiver 200, which is prone to shading by a reflecting element, can be allocated for the necessary but non-active function of routing electrical power between the photo-sensitive elements. This in turn frees up other surface area on receiver 200 to be occupied by the active elements able to convert incident light into electrical energy. Such allocation of receiver surface area to active elements increases collection efficiency.

Figure 2E:
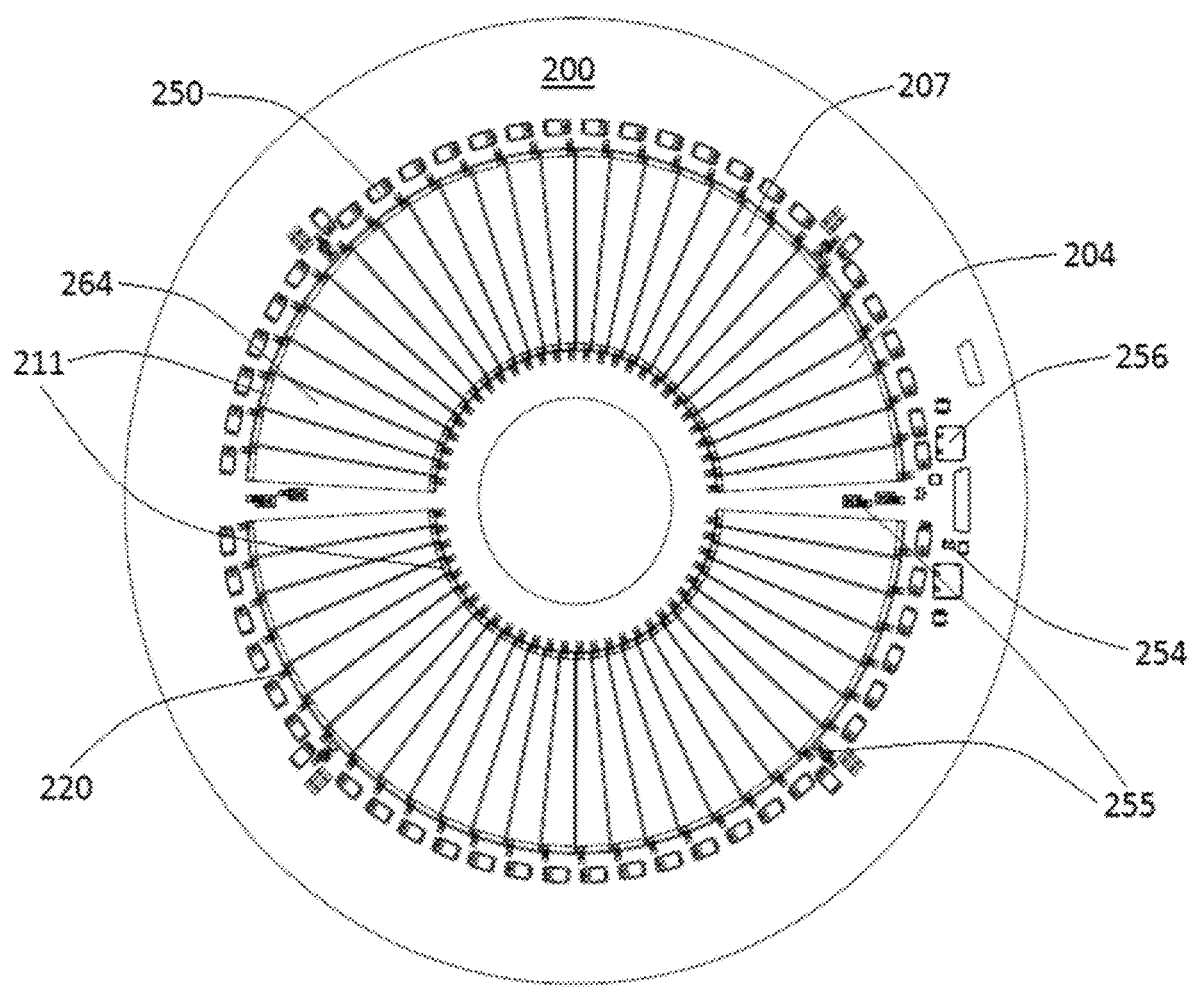
FIG. 2E shows a plan view of an embodiment a single ring of cells according to an embodiment of the present invention.

FIG. 2E shows an embodiment of a solar receiver 200 composed of a single ring 207 of dual busbar cells 264. The embodiment illustrated in FIG. 2E offers better conversion efficiency for non-uniform illumination profiles. In this embodiment, the multi-prong contact 220 is reduced to a single leg. Receiver 200 also incorporates extent sensor elements 255, which are described in detail below. Embodiments illustrated in FIGS. 2-2E provide close contact between the PV cells through bonding of layers from PV cell 210, solder/adhesive 215, conductor 217, dielectric 224, and substrate 222 (which together form a thermal stack). This minimizes contact resistance and thermal resistance leading to a lower cell temperature and more efficient cell operation.

It is desirable to have a high concentration of solar radiation on the photovoltaic cells because it reduces the amount of expensive photovoltaic material in the system. This also increases the conversion efficiency of the cells. The portion of the incident sunlight not converted to electricity by the photovoltaic cells is absorbed and converted to heat.

Since the conversion efficiency of common photovoltaic cells decreases with increasing temperature, it may be desirable that the system include a heat exchanger that can remove the heat from the cells to keep their temperature as low as possible. In fact, at very high solar concentrations, system survival may depend upon efficient heat removal. One technique for efficient heat removal may be to keep the distance over which the heat must flow as small as possible. One possible mechanism is to provide heat exchangers with small physical dimensions, in particular thin layers of materials comprising the thermal stack. The back side of the PCB or the metal substrate that is in thermal communication with the PV cells may feature pins, channels or other geometrical features to enhance heat transfer, as described above. Such geometrical features in combination with a flow of cooling fluid such as air or water, may serve to keep the temperature of the receiver within desirable levels.

In order to reduce the overall receiver module cost as well as the cost of the cooling system and its operation, it may be desirable to cool the solar module at the lowest possible fluid flow rate and pressure drop. Turbulent flow may be used to draw hot liquid from the wall chaotically through the bulk of the liquid. Most liquid heat exchangers for solar cooling employ cooling tubes, which require a high Reynolds number to benefit from eddy-based transport of hot liquid from the wall. If the channel is reduced in size to increase the Reynolds number to improve eddy transport, the pressure drop increases. If the channel diameter is increased at constant Reynolds number, the flow rate increases. Natural convection of heat from the PC board and/or substrate can be enhanced by any combination of eddying, forced convection, nucleate boiling, and film boiling. Moreover, a surface area of the PCB and/or substrate available for heat transfer can be increased by techniques such as texturing or molding. In some embodiments, forced convection techniques may also be employed.

Figure 2F:
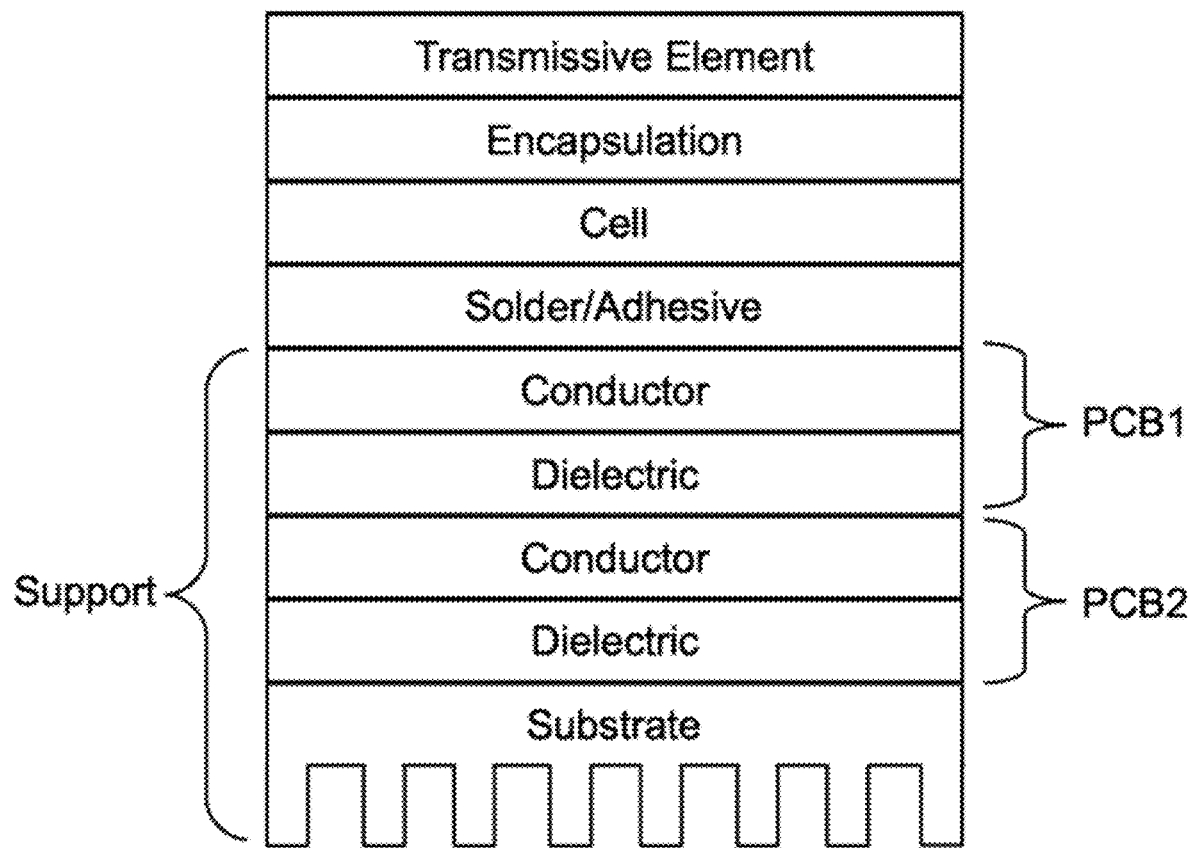
FIG. 2F shows a simplified generic cross-sectional view of an alternative embodiment of a receiver employing multiple printed circuit boards.

The present invention is not limited to the particular receivers of FIGS. 2-2E, and one skilled in the art will realize that variations are possible. For example, while the embodiments disclosed above include a single PCB, this is not required and alternative embodiments could employ multiple PCBs as is shown generically in FIG. 2F. In embodiments utilizing multiple PCBs, patterning of the conductor and conducting vias in the various layers can accommodate a variety of routing paths in a manner analogous to the interconnect metallization schemes commonly implemented in integrated circuit design. Such flexibility in routing may afford further opportunity for placement and sizing of active devices to maximize collection efficiency.

The various techniques employed by embodiments of the present invention may be used on single or multilayer interconnect levels. Single layer designs reduce cost and simplify thermal stack, enhancing heat transfer. Multilayer designs may allow for more complex topologies and smaller critical footprints. While FIGS. 2-2E illustrates embodiments of receivers comprising a plurality of front contact cells, the present invention is not limited to this particular form of active element. According to alternate embodiments, back contact cells may be connected directly onto the substrate and routed to give the desired circuit configuration using a single or multilayer PCB with minimal grout loss. Back contact cells may have various contact patterns according to their type. Back junction, emitter wrap through, or metallization wrap through PV cells may be used in conjunction with the PCB, in order to create desirable combinations of connections on a single layer or on multiple layers. PV cells formed utilizing through hole contacts or vias may also be used. This process is generally known as "through silicon via" or TSV.

It is to be noted that the present invention is not limited to embodiments utilizing active devices (e.g., PV cells) of any particular shape or arranged in any particular spatial orientation. For example, the receiver 200 of FIGS. 2-2E comprises a plurality of trapezoidal active elements arranged in an annular fashion on a circular support, however, this is not required. Alternative embodiments could utilize active devices having other shapes, arranged in a different manner, and/or on supports that are other than circular in shape, and still remain within the scope of the present invention.

FIGS. 3A and 3B illustrate a receiver according to another embodiment of the present invention. The embodiments illustrated in FIGS. 3A-3B employ a "shingling" technique where a bottom contact 340 of one cell 300 is attached to a busbar 311 of another cell 300. This creates a step height difference equal to the thickness of cell 300, plus the thickness of any attachment medium. The overlap is designed such that the bottom cell is not shaded and additional contacts are not required to produce a series connection. The tilted spatial orientation of the embodiments of FIGS. 3A-3B allows a region of the active area of a front contact PV cell 300 to overlap non-active busbar 311 of next front contact PV cell 305, increasing collection efficiency. It also eliminates the need for a multi-prong structure for adjacent cell connections thereby reducing cost. Further, the shingling method allows contact along the long direction of the cells, allowing grid lines to traverse the cell, thereby minimizing series resistance.

Receiver topologies and interconnects based on the shingling technique described above can utilize thermally conducting and insulating adhesives and combinations thereof. In the embodiments of FIGS. 3A-3B, the PV cells are connected electrically using the conducting adhesive 340, and are isolated from each by direct mounting in the thermally conductive but electrically insulating adhesive 342. Substrate 302 may be faceted to create a flat surface as in FIG. 3A, or it may not be as shown in FIG. 3B. Conducting adhesive 340 and insulating adhesive 342 may be chosen based upon chemical compatibility with the cell metallization and other metals that they contact in order to avoid corrosion issues.

Different rows or annuli of cells can be connected together using a thin sheet of conductive metal chemically compatible with the adhesive. The thin sheet metal connections may be used to create different series/parallel interconnect topologies as desired. Such an approach eliminates certain steps in conventional substrate fabrication and cell packaging processes, resulting in cheaper and faster production of multi-element receivers with minimal grout.

Figure 4:
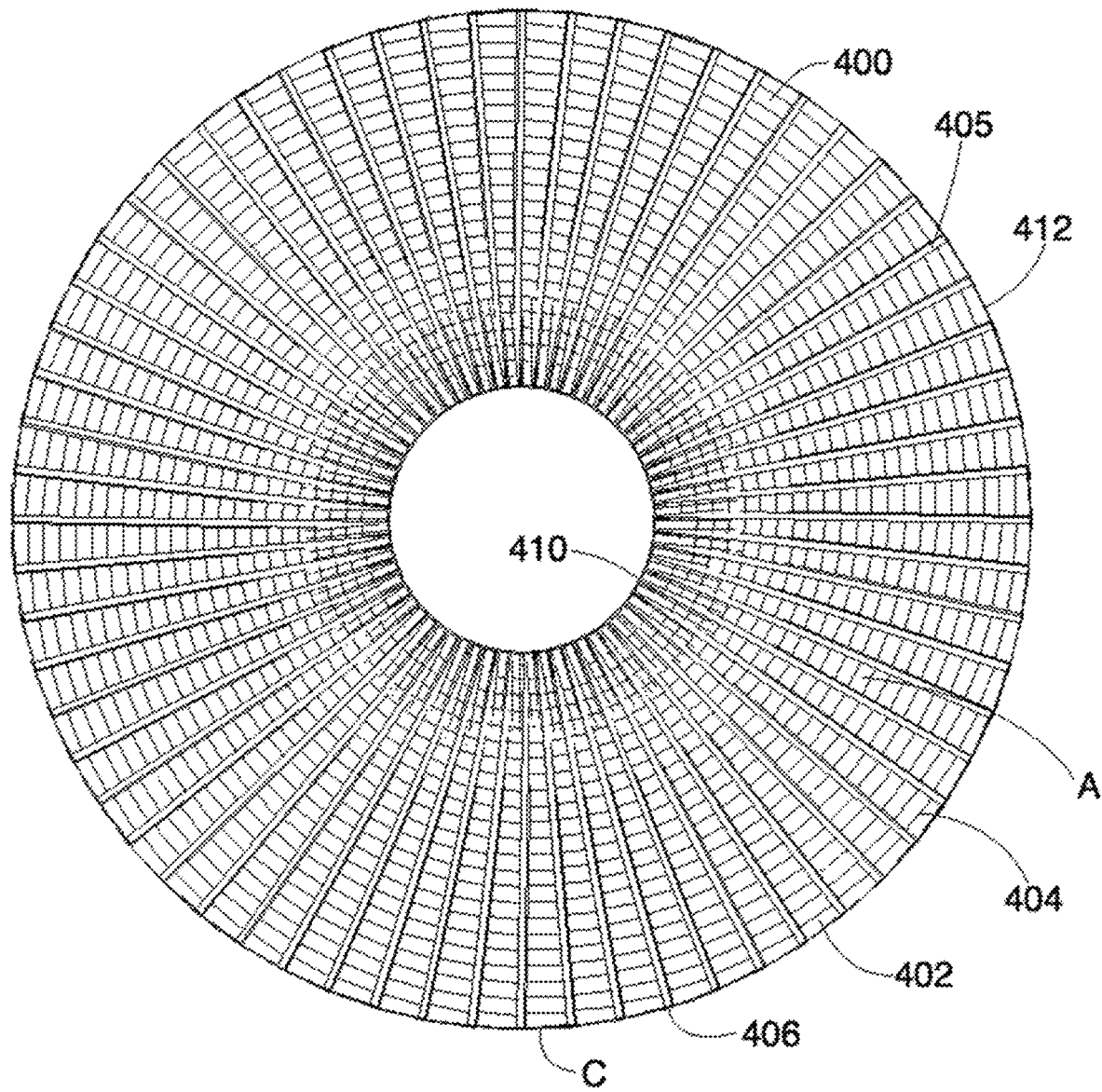
FIG. 4 shows a simplified plan view of another alternative embodiment utilizing the shingling approach, with shaped cells arranged in an annular manner.

Embodiments of the present invention may employ the shingling technique described above to create receivers that have a square or rectangular shape, or other shapes including circular. Shingling may be used with active cells of rectangular or other shapes such as polygons, angular wedges (trapezoids having opposite surfaces curved), and others depending on the area that is to be covered. According to particular embodiments, trapezoids or angular wedges may be shingled together to produce a circular topology with minimal grout. FIG. 4 shows such an embodiment utilizing cells arranged in an annular manner. Such a configuration may be useful where the illumination profile is expected to be circular in shape.

Shingling may also be used on three dimensional surfaces to create non-flat surfaces. For example, FIG. 3A shows a planar substrate. A non-planar dielectric material 342 is formed between front contact cells 300 and the planar surface 302a of substrate 302. The edge of one cell 300 overlaps a portion of the adjacent cell 305, to which it is electrically connected through conducting adhesive 340 and busbars 311. An encapsulant 380 overlies the cells. A transmissive optical element 333 overlies encapsulate 380. In some embodiments, cells may be arranged in shapes to approximate cylinders, polyhedra, or other complex shapes of arbitrary geometry.

FIG. 3B shows another embodiment utilizing shingling. As illustrated in FIG. 3B, the top surface of substrate 302 is not planar, but rather comprises a plurality of inclined facets. This embodiment, similar to the one illustrated in FIG. 3A, allows the non-active receiver elements (e.g., busbar 311, conducting adhesive 340, etc.) to be shaded by an overlapping portion of the adjacent active receiver element thereby enhancing the utilization of receiver surface area and increasing efficiency. A non-planar substrate surface as shown in FIG. 3B can reduce the average thickness of adhesive 342 which in turn can improve heat transfer and reduce temperature difference between cells 300, 305 and substrate 302 which improves efficiency and mechanical robustness. In some embodiments, faceted surfaces reduce the thickness of the dielectric material and improve thermal performance.

FIG. 4 shows a simplified plan view of a receiver according to another embodiment of the present invention. As illustrated, receiver uses the shingling technique to approximate an annular shape. A single ring is composed of a plurality of shaped solar cells 400. This ring may or may not be used with a central reflector 410 and a peripheral reflector 412.

Figure 4A:
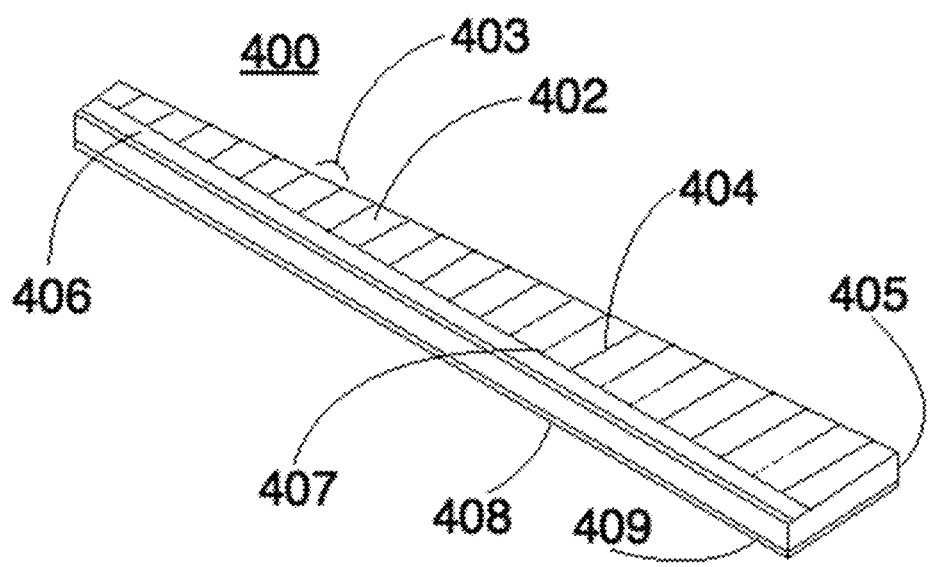
FIG. 4A shows a perspective view of a shaped cell utilized in the embodiment shown in FIG. 4.

FIG. 4A shows an individual shaped cell 400 according to an embodiment of the present invention. Cell 400 includes a non-active busbar 406, a plurality of fingers, 404, and an active area 402. Busbar 406 and fingers 404 form a comb-like structure 407. The bottom region of the cell contains a metallization layer 409 with a contact surface 408. The edge of the cell 405 is shown. Cell 400 can utilize a short finger length reducing electrical communication distance to the busbar, which minimizes losses due to non-uniform illumination. This finger spacing 403 can be adjusted to provide optimal efficiency for a given concentration ratio. In some embodiments, the optimal finger spacing may be non-uniform along the length of cell 400.

Figure 4B:
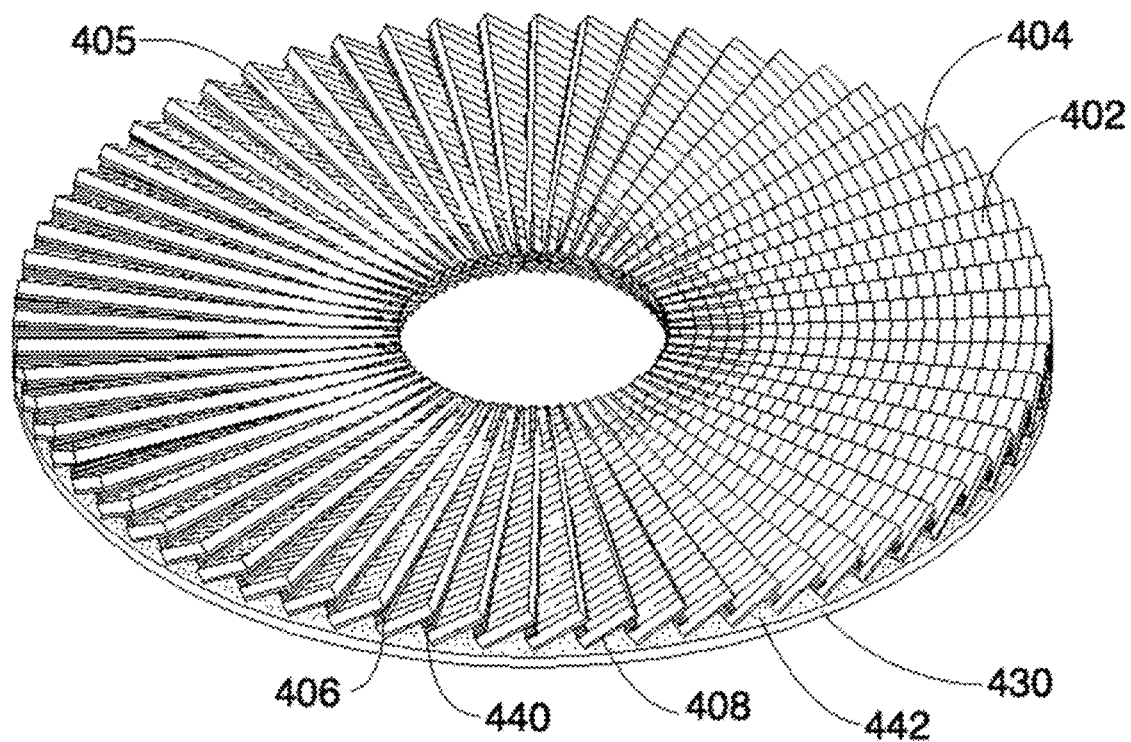
FIG. 4B shows a simplified perspective view of a shaped cell utilized in the embodiment shown in FIG. 4.

FIG. 4B shows a perspective view of the tiling or shingling of the cells into a receiver. Electrical communication between cells is established via a connection stack 440. A dielectric 442 insulates the cells from substrate 430 and provides thermal communication between cells 400 and substrate 430. Dielectric 442 may be a thermally conductive insulating adhesive. Substrate 430 may or may not be actively cooled by circulating a fluid and may or may not be faceted. In this particular embodiment, the shingling angle is higher on the inside of the ring than on the outside. In some embodiments, the shingling angle is a function of receiver radius. Edge 405 of each cell is also an active element. This particular embodiment results in a very low grout loss, approaching zero, and eliminates the need for a multi-prong interconnect structure, and may lead to a cheaper manufacturing process.

Figure 4C:
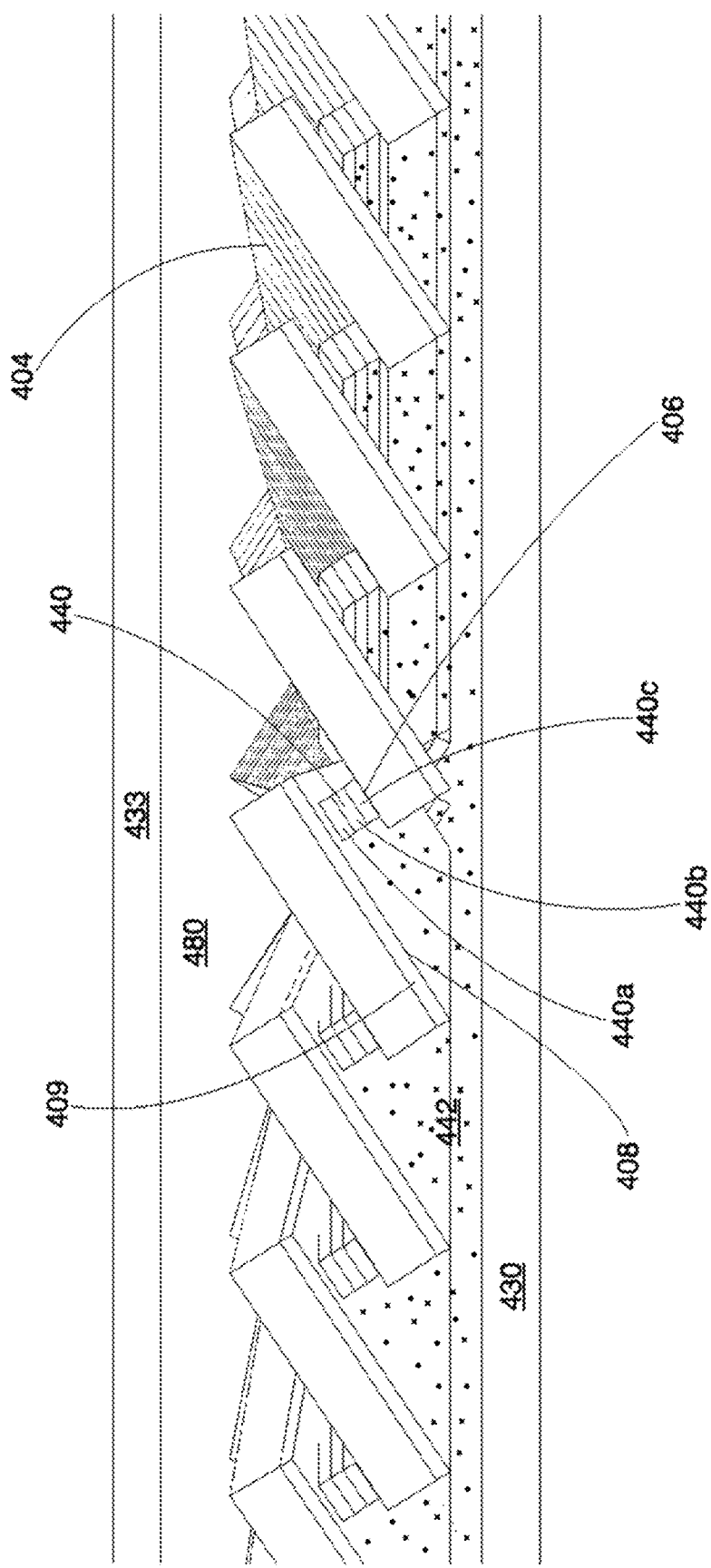
FIG. 4C shows a simplified cross-sectional view of a shaped cell utilized in the embodiment shown in FIG. 4.

FIG. 4C shows a more detailed, but still simplified, side view of the receiver of FIG. 4 according to an embodiment of the present invention. As illustrated in FIG. 4C, the receiver includes a transmissive optical element 433 overlying an encapsulant 480. Encapsulant 480 is used to bind the various PV cells together and provide structural support to the receiver. Electrical communication between the PV cells is established through connection stack 440 which is in contact with cell metallization surface 408 and busbar 406. Stack 440 may be composed of three or more layers, 440a, 440b, and 440c. Composition of each layer 440a, 440b, and/or 440c can be varied according to the type of electrical connection to be made. Connections may be made for series, parallel, or combinations thereof.

Examples of composition of stack 440 are illustrated in FIGS. 4C1 through 4C4 according to an embodiment of the present invention. For example, FIG. 4C1 shows that stack 440 can include three identical layers of electrically conducting adhesive 450 in contact with the back surface metallization of one cell and the busbar 406 of an adjacent cell. Such a connection provides for a series connection between cells.

FIG. 4C2 illustrates a connection stack 440 that includes a thin conducting metal layer 452 sandwiched between two layers of electrically conducting adhesive 450 thereby electrically connecting adjacent cells. In some embodiments, the thin conducting metal 452 can be used to provide electrical communication to external circuitry such as bypass diodes. Metal 452 extends radially in the view shown in FIG. 4. FIGS. 4C3 and 4C4 show examples of connection stacks 440 and how power output terminal connections may be made. An electrically insulating adhesive 454 electrically isolates the back surface metallization 408 and busbar region of 406 of adjacent cells. This allows for a single terminal or polarity to be connected to an external circuit. The stack shown in FIG. 4C4 may be connected to the same back side metallization surface 408 of cell in FIG. 4C3, as illustrated in FIG. 4C4. This allows the opposite polarity terminal to 4C3 to be connected to an external circuit. Dielectric 442 insulates the thin metal conductor 452 from electrical communication with other cells or the substrate.

Figure 5:
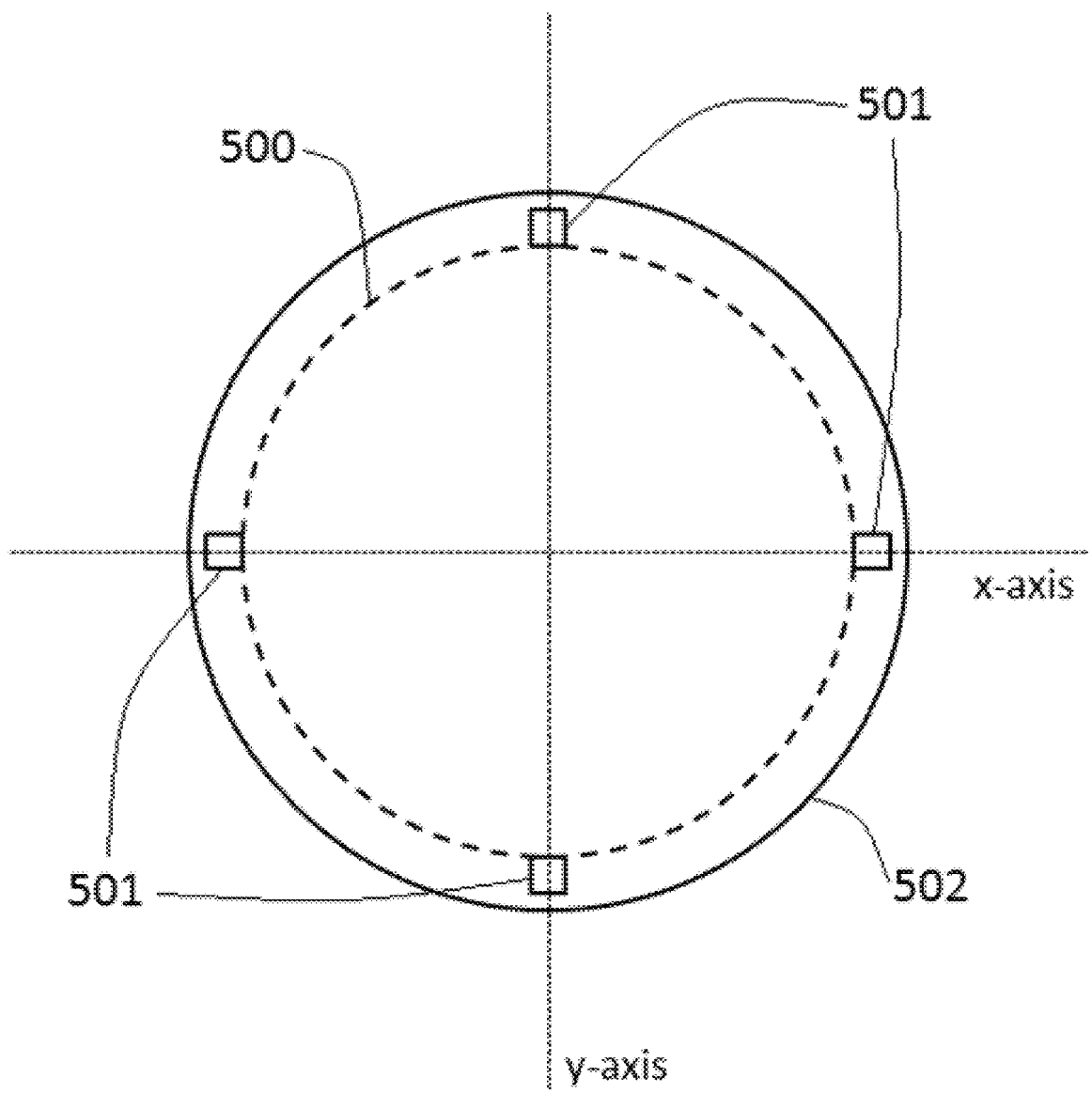

FIG. 4C5 shows a flattened perspective view of FIG. 4C illustrating the use of a connection stack to provide access to positive and negative circuit terminals. The backside metallization surface is typically positive polarity (+), while busbar, 406 is negative (−) for common p-type front contact solar cells. For a single annulus of cells to all be connected in series, access to the busbar of first cell 415 in the series and access to back contact of the last cell in series 416 is needed. This is obtained by the use of two electrically conducting adhesive layers connecting two metal foil or ribbon layers 452 that extend beyond the extent of the cells 400. These two metal layers are isolated electrically from one another by the use of an electrically insulating adhesive 454.

As is well known, the position of the sun in the sky continually changes during the daytime as the earth rotates. In order to receive the maximum amount of radiation from the sun, it is desirable that the receiver directly faces the sun as much as possible. In order to determine the optimal position of the receiver with respect to the sun, it is advantageous to determine the position of the sun at any given time. Once the position of the sun is determined, the receiver can be moved/focused accordingly to receive the maximum radiation from the sun.

The position of the sun in the sky can be calculated directly using the date, time, and geographical location of the receiver. In practice; however, variations in such factors as terrain, manufacturing, and/or assembly of the receiver limit the tracking accuracy of this purely analytical approach. A more accurate tracking system utilizing sensors can provide a more robust system capable of the tight tracking tolerances required for CPV power generation. The sensors can help more accurate tracking of the sun thereby increasing receiver power output."

FIG. 5 illustrates a solar receiver including tracking sensors according to an embodiment of the present invention. As illustrated in FIG. 5, fine tracking extent sensor elements 501 are placed just outside the illuminated region 500 on a solar receiver 502. Extent sensors 501 make use of the printed circuit board functions of the solar receiver. In some embodiments, extent sensors 501 can be electrically and mechanically connected to traces or pads via the printed circuit board of the receiver substrate. In this embodiment, extent sensors 501 are placed in symmetric co-linear pairs along an X axis and a Y axis.

Sensors 501 may be optical or thermoelectric devices including but not limited to photovoltaic cells, photodiodes, thermopiles, or pyroelectrics. Using photovoltaic cell material may be beneficial due to the cell's ability to withstand concentrated sunlight and produce an electrical signal that is proportional to the illumination level. If sensors 501 are identical or calibrated, they will give the same response for a given illumination intensity and function as follows. For example, when the receiver is pointed ideally, the signals from sensors 501 at the extent of the spot will be equal and minimal. The position error of a mispointed receiver can be resolved into orthogonal basis vector components. When the receiver is mispointed, the signal from the perimeter sensor pairs in the x- and/or y-axis will be unequal. The magnitude of the difference in signals from any sensor pair will vary proportionally to the degree of the mispointing component along that particular axis. The characteristic curve of the difference in power signals along each axis can easily be linearized for small pointing errors.

For concentrating systems with variable focal length, extent sensors 501 may also be used to control the size (e.g., area) and disposition of illuminated region 500. For example, when the solar spot is of ideal size, the signal from the four perimeter sensors 501 will be equal and minimal. The solar spot size is proportional to the sums of the signals of the four sensors. Thus, minimizing differences between the sensor pairs and bounding the value of the sum of the sensor signals can yield an illuminated region that is both centered and of the desired illumination intensity.

In some embodiments, the extent sensors may be used to provide continuous spatial position information over a given range or to provide binary information. For example, when sensors 501 are deployed as continuous spatial measurement devices, a balance between sensors 501 on each axis is sought.

When the sensors are deployed as discrete spatial measurement devices, a threshold energy for each extent sensor may be defined such that when the threshold is met the signal goes from 'off', binary 0 to 'on', binary 1. The sum and difference equations required for control can then be represented in boolean form for a binary system.

Figure 5A:
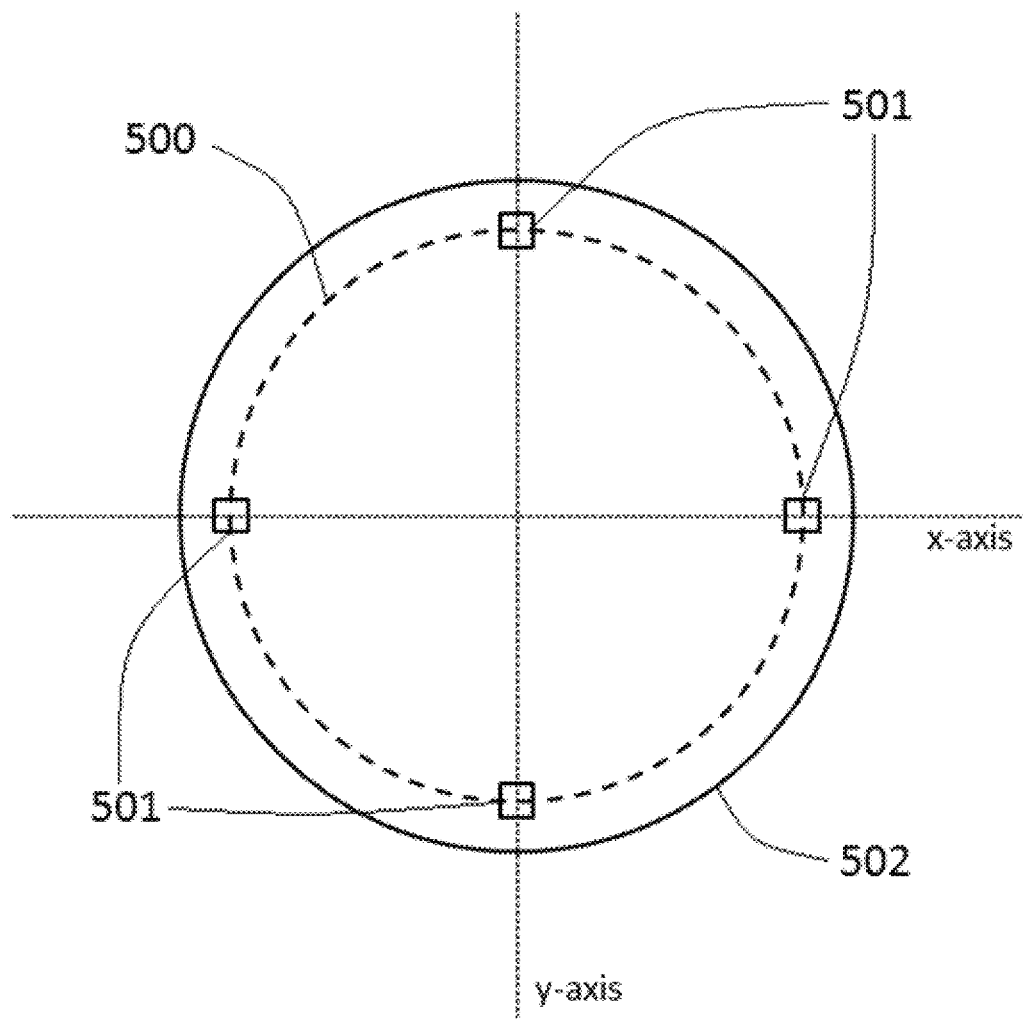
FIG. 5A shows a simplified schematic diagram of a solar receiver with extent sensors positioned straddling the illuminated area according to an embodiment of the present invention.

There are many different arrangements of extent sensors as shown in FIGS. 5 and 5A. Extent sensors may be located in, out, or straddling the illumination region. FIG. 5A illustrates sensors 501 straddling illumination region 500. In some embodiments, symmetrical or asymmetrical configurations for the sensors may be used with an even or odd number of extent sensor elements. In some embodiments, sensors may also be rotated at an angle relative to the principle axes.

Figure 6:
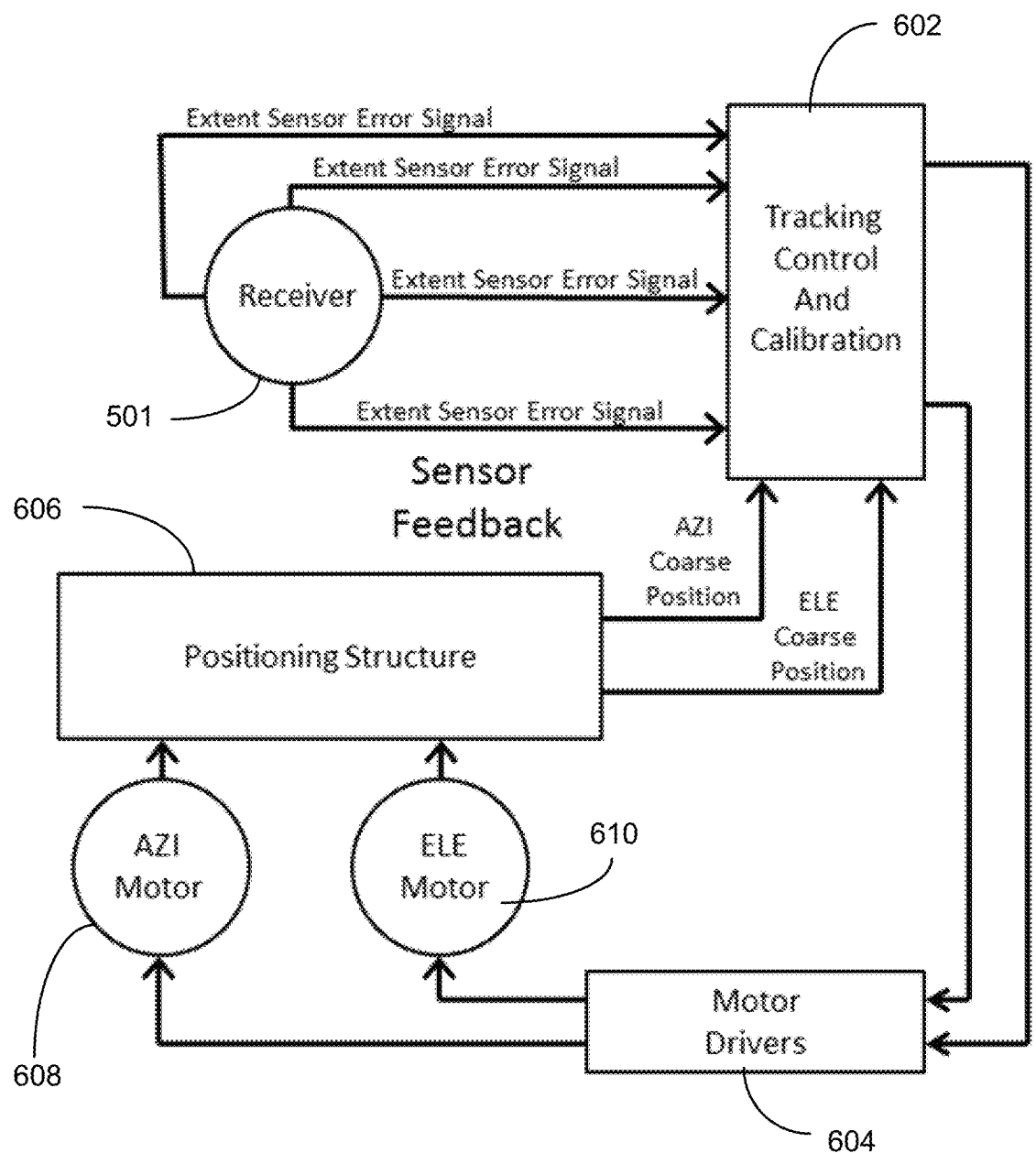
FIG. 6 shows a simplified control schematic for closed loop error processing of extent sensor signals according to an embodiment of the present invention.

FIG. 6 illustrates an example feed-back control scheme utilizing both coarse and fine tracking according to an embodiment of the present invention. Coarse elevation and azimuth ("ELE" and "AZI) are calculated given the geographical position of the structure and the time and date. Extent sensor electrical signals are read and interpreted. Adjustments are then made to the position of the structure by actuating ELE or AZI motors. This loop runs continuously or at specified time intervals providing accurate position control of the illumination region on the solar receiver.

Positioning structure 606 includes a frame on which a solar receiver can be mounted. Thus, positioning structure 606 provides the support for the solar receiver and associated electronics. Positioning structure 606 has an associated geographical location and elevation information. In in application, we refer to the geographical location for positioning structure 606 is referred to as the "coarse" position. Usually, positioning structure 606 is placed on the ground and may have associated elevation information.

Sensors 501 (e.g., extent sensors described above) may be mounted directly on the solar energy receiver and may determine position information for the Sun. The position information determined by sensors 501 is communicated to tracking control system 602. Tracking control system 602 receives inputs from sensors 501 about the location of the Sun and the geographical location of positioning structure 606. Based on that information, tracking control system 602 determines the optimal orientation for the solar receiver. Once the optimal orientation is determined, tracking control system 606 drives motors 608 and 610 via motor driver 604 to orient the solar receiver in the desired orientation.

Tracking control system 602 continually receives position information from positioning structure 606 and sensors 501 and based on that, adjusts the positioning structure so that the solar receiver is oriented in a manner so as to collect maximum solar energy.

The tracking system illustrated in FIG. 6 can be deployed in either online tracking or offline calibration to account for terrain variation. In some embodiments, the tracking system can be directly integrated into the online closed-loop control algorithm or it can be used simply as a range governor during online tracking. In some applications the tracking system may be used in an offline closed-loop calibration process, in which data gathered is used to create an open-loop calibration transform applied to either the position command or the observed error.

Having thus described exemplary embodiments of the present invention, it should be noted by those skilled in the art that the within disclosures are exemplary only and that various other alternatives, adaptations, and modifications may be made within the scope of the present invention. Accordingly, the present invention is not limited to the specific embodiments as illustrated herein, but is only limited by the following claims.

The invention claimed is:

1. A solar energy receiver comprising:
   a plurality of photovoltaic (PV) cells, each PV cell including a front surface including a metallization structure that extends from a first edge of each PV cell towards an opposing second edge of each PV cell and a back surface including a conducting layer;
   a first metal layer sandwiched between the conducting layer of the back surface of a first PV cell of the PV cells and an insulating layer;
   a second metal layer sandwiched between the insulating layer and the metallization structure of the front surface of a second PV cell of the PV cells, wherein
   the second edge of the back surface of the first PV cell partially overlaps the first edge of the front surface of the second PV cell, and
   the first and second metal layers extend beyond an extent of the first and second PV cells to electrically connect to an external circuit.

2. The solar energy receiver of claim 1, wherein the PV cells are arranged in an annulus.

3. The solar energy receiver of claim 1, further comprising a support structure that supports the PV cells, wherein the support structure comprises:
- a thermally conducting substrate having an upper surface and an opposing lower surface;
- a metal layer disposed on the lower surface;
- one or more cooling channels coupled to the lower surface; and
- a printed circuit board (PCB) coupled to the upper surface.

4. The solar energy receiver of claim 1, wherein each of the PV cells are non-square in shape.

5. The solar energy receiver of claim 1, wherein the first and second metal layers are bonded to the insulating layer and a respective one of the conducting layer of the back surface of the first PV cell or the metallization structure on the front surface of the second PV cell by an electrically conductive adhesive that includes epoxy, acrylic, polyimide, polyurethane, cyanate esters, or silicone.

6. The solar energy receiver of claim 1, wherein the external circuit includes a bypass diode.

* * * * *

UNITED STATES PATENT AND TRADEMARK OFFICE
CERTIFICATE OF CORRECTION

| | | |
|---|---|---|
| PATENT NO. | : 11,652,180 B2 | Page 1 of 1 |
| APPLICATION NO. | : 15/815420 | |
| DATED | : May 16, 2023 | |
| INVENTOR(S) | : John Liptac et al. | |

It is certified that error appears in the above-identified patent and that said Letters Patent is hereby corrected as shown below:

On the Title Page

Item (73) the Assignee's city of residence should read:
-- (73) Assignee: Maxeon Solar Pte. Ltd., Singapore (SG) --

Signed and Sealed this
Fifth Day of December, 2023

Katherine Kelly Vidal
*Director of the United States Patent and Trademark Office*